(12) United States Patent
Kim et al.

(10) Patent No.: US 10,795,223 B2
(45) Date of Patent: Oct. 6, 2020

(54) DISPLAY DEVICE

(71) Applicant: Samsung Display Co., Ltd., Yongin-si (KR)

(72) Inventors: Sunghyun Kim, Hwaseong-si (KR); Seungjae Kang, Asan-si (KR); Nagjoon Kim, Asan-si (KR); Chunghyuk Shin, Asan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/677,070

(22) Filed: Nov. 7, 2019

(65) Prior Publication Data

US 2020/0150479 A1 May 14, 2020

(30) Foreign Application Priority Data

Nov. 8, 2018 (KR) .................. 10-2018-0136696

(51) Int. Cl.
*G02F 1/1345* (2006.01)
*G09G 3/36* (2006.01)
*H01L 27/12* (2006.01)
*G02F 1/1368* (2006.01)

(52) U.S. Cl.
CPC ........ *G02F 1/13452* (2013.01); *G02F 1/1368* (2013.01); *G09G 3/3648* (2013.01); *G09G 3/3685* (2013.01); *H01L 27/124* (2013.01); *G09G 2300/0426* (2013.01)

(58) Field of Classification Search
CPC .............. G02F 1/13452; G09G 3/3685; G09G 2300/0426; H01L 27/124
See application file for complete search history.

(56) References Cited

U.S. PATENT DOCUMENTS

| 7,649,585 | B2 * | 1/2010 | Jeoung | G02F 1/1309 349/187 |
| 8,994,042 | B2 | 3/2015 | Kang et al. | |
| 9,354,457 | B2 * | 5/2016 | Nishino | G02F 1/1309 |
| 9,524,683 | B2 * | 12/2016 | Fujikawa | G02F 1/13454 |
| 2004/0012744 | A1 * | 1/2004 | Ishige | G02F 1/1345 349/139 |
| 2005/0168456 | A1 * | 8/2005 | Nakayama | G09G 3/006 345/204 |
| 2010/0006838 | A1 * | 1/2010 | Yoshida | G09G 3/006 257/48 |
| 2011/0018142 | A1 * | 1/2011 | Kawamura | G02F 1/1345 257/776 |

(Continued)

FOREIGN PATENT DOCUMENTS

KR 10-2015-0074275 7/2015

*Primary Examiner* — Phu Vu
(74) *Attorney, Agent, or Firm* — H.C. Park & Associates, PLC

(57) ABSTRACT

A display device including a base member, a plurality of transistors, a plurality of pad parts, a plurality of signal lines, and a blocking pad. Each of the plurality of transistors includes a control electrode, an input electrode, and an output electrode, and is disposed on the center area. The blocking pad is disposed between two adjacent signal lines among the plurality of signal lines. A part of the blocking pad is disposed on the same layer as at least any one of the control electrode, the input electrode, and the output electrode.

20 Claims, 13 Drawing Sheets

(56) References Cited

U.S. PATENT DOCUMENTS

| | | | |
|---|---|---|---|
| 2011/0127536 A1* | 6/2011 | Yoshida | G09G 3/006 257/59 |
| 2013/0321724 A1* | 12/2013 | Chen | G02F 1/136286 349/33 |
| 2014/0111724 A1* | 4/2014 | Nishino | G02F 1/133514 349/43 |
| 2014/0184969 A1* | 7/2014 | Ro | G02F 1/13458 349/43 |
| 2014/0203835 A1* | 7/2014 | Ro | G09G 3/006 324/760.02 |
| 2015/0194109 A1* | 7/2015 | Fujikawa | G02F 1/1309 345/100 |
| 2015/0332644 A1* | 11/2015 | Fujikawa | G02F 1/13452 345/100 |
| 2016/0011108 A1* | 1/2016 | Jeon | G09G 3/3648 356/445 |
| 2016/0328062 A1* | 11/2016 | Jin | G02F 1/1345 |
| 2017/0146878 A1* | 5/2017 | Hirata | G02F 1/136286 |
| 2017/0212395 A1* | 7/2017 | Hirata | G02F 1/1368 |
| 2017/0219858 A1* | 8/2017 | Nishino | G02F 1/134363 |

\* cited by examiner

DISPLAY DEVICE

CROSS-REFERENCE TO RELATED APPLICATION

This application claims priority from and the benefit of Korean Patent Application No. 10-2018-0136696, filed on Nov. 8, 2018, which is hereby incorporated by reference for all purposes as if fully set forth herein.

BACKGROUND

Field

Exemplary embodiments of the invention relate generally to various display devices, which are used in multi-media devices such as a television, a mobile phone, a tablet computer, a navigator, and a game player.

Discussion of the Background

Currently, in order to implement a display device in which a size of the bezel is minimized, a technology is being developed in which a connection electrode is disposed in a side surface of a display panel to electrically connect the display panel and a driving chip. Here, the connection electrode may be disposed on the display panel in a form of a whole plate and then patterned using laser patterning technology.

However, there has been an issue that the display panel is damaged by laser light in a process of patterning the connection electrode.

The above information disclosed in this Background section is only for understanding of the background of the inventive concepts, and, therefore, it may contain information that does not constitute prior art.

SUMMARY

Devices constructed according to exemplary implementations and methods of the invention are capable of providing a display device in which a display panel is prevented from being damaged and durability is improved.

Additional features of the inventive concepts will be set forth in the description which follows, and in part will be apparent from the description, or may be learned by practice of the inventive concepts.

An exemplary embodiment of the inventive concepts provides a display device including a first base substrate, a second base substrate, a liquid crystal layer, a first connection electrode, a second connection electrode, a first signal transfer part, a second signal transfer part, and a blocking pad.

The first base substrate may include an upper surface, a lower surface, and a plurality of side surfaces connecting the upper surface and the lower surface, and the upper surface may include a first part and a second part configured to surround the first part.

The second base substrate may face the first base substrate.

The liquid crystal layer may be disposed between the first base substrate and the second base substrate, and configured to overlap the first part and not to overlap the second part.

The first connection electrode may be disposed on a first side surface among the plurality of side surfaces.

The second connection electrode may be disposed on the first side surface and separated from the first connection electrode.

The first signal transfer part may be disposed on the upper surface, extended in a first direction, and configured to contact the first connection electrode and receive an electrical signal.

The second signal transfer part may be disposed on the upper surface, extended in the first direction, and configured to contact the second connection electrode and receive an electrical signal.

The first blocking pad may be configured to overlap the second part of the upper surface, disposed between the first signal transfer part and the second signal transfer part, and separated from the first signal transfer part and the second signal transfer part.

The first blocking pad may be insulated from the first signal transfer part and the second signal transfer part, and extended in the second direction which intersects with the first direction.

The first signal transfer part may include a first pad part configured to contact the first connection electrode, a first line part extended from the first pad part and having a smaller width than the first pad part, and the second signal transfer part may include a second pad part configured to contact the second connection electrode, and a second line part extended from the second pad part and having a smaller width than the second pad part.

The first blocking pad may be disposed between the first line part and the second line part.

The display device may further include a transistor including a control electrode, an input electrode, and an output electrode, and disposed on the first part of the upper surface. At least a part of the first blocking pad may be disposed on the same layer as at least one of the control electrode, the input electrode, and the output electrode.

The first blocking pad may include a first sub-blocking pad provided in the same process as the control electrode, and a second sub-blocking pad provided in the same process as the input electrode and the output electrode.

The display device may further include a gate driving circuit and a data driving circuit, wherein any one of the gate driving circuit and the data driving circuit is electrically connected to the first connection electrode and the second connection electrode.

The display device may further include a fourth connection electrode, a third signal transfer part, a fourth signal transfer part, and a second blocking pad.

The third connection electrode may be disposed on a second side surface among the plurality of side surfaces of the first base substrate.

The fourth connection electrode may be disposed on the second side surface and separated from the third connection electrode.

The third signal transfer part may be disposed on the upper surface, extended in the second direction, and configured to contact the third connection electrode to receive an electrical signal.

The fourth signal transfer part may be disposed on the upper surface, extended in the second direction, and configured to contact the fourth connection electrode to receive an electrical signal.

The second blocking pad may be configured to overlap the second part of the upper surface, disposed between the third signal transfer part and the fourth signal transfer part, and separated from the third signal transfer part and the fourth signal transfer part.

The other one of the gate driving circuit and the data driving circuit may be electrically connected to the third connection electrode and the fourth connection electrode.

The second blocking pad may be insulated from the third signal transfer part and the fourth signal transfer part, and extended in the first direction.

In an exemplary embodiment of the inventive concepts, a display device includes a base member, a plurality of transistors, a plurality of pad parts, a plurality of signal lines, and a plurality of blocking pads.

The base member may include a center area and an edge area configured to surround the center area.

Each of the plurality of transistors may include a control electrode, an input electrode, and an output electrode, and be disposed on the center area.

The plurality of pad parts may be disposed on the edge area.

The plurality of signal lines may be electrically and respectively connected to the plurality of pad parts, and electrically and respectively connected to the plurality of transistors.

The blocking pad may be disposed on the edge area and between two adjacent signal lines among the plurality of signal lines.

At least a part of the blocking pad may be disposed on the same layer as at least any one of the control electrode, the input electrode, and the output electrode.

The display device may further include a plurality of light emitting elements disposed on the base member, configured to overlap the center area, and electrically connected to the plurality of transistors.

The display device may further include a plurality of connection electrodes disposed on one side surface of the base member and configured to respectively contact the plurality of pad parts.

The blocking pad may include a first sub-blocking pad and a second sub-blocking pad. The first sub-blocking pad may include the same material as the control electrode, the second sub-blocking pad may include the same material as at least any one of the input electrode or the output electrode, and the first sub-blocking pad may overlap the second sub-blocking pad.

The blocking pad may be insulated from the plurality of signal lines.

Each of the plurality of signal lines may be extended in a first direction, the blocking pad is extended in a second direction which intersects with the first direction, the width of each of the plurality of signal lines may be smaller than that of each of the plurality of pad parts, and at least a part of the blocking pad may overlap at least any one of the plurality of pad parts in the first direction.

The blocking pad may be provided in plurality, and each of the plurality of blocking pads may be disposed between the plurality of signal lines.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
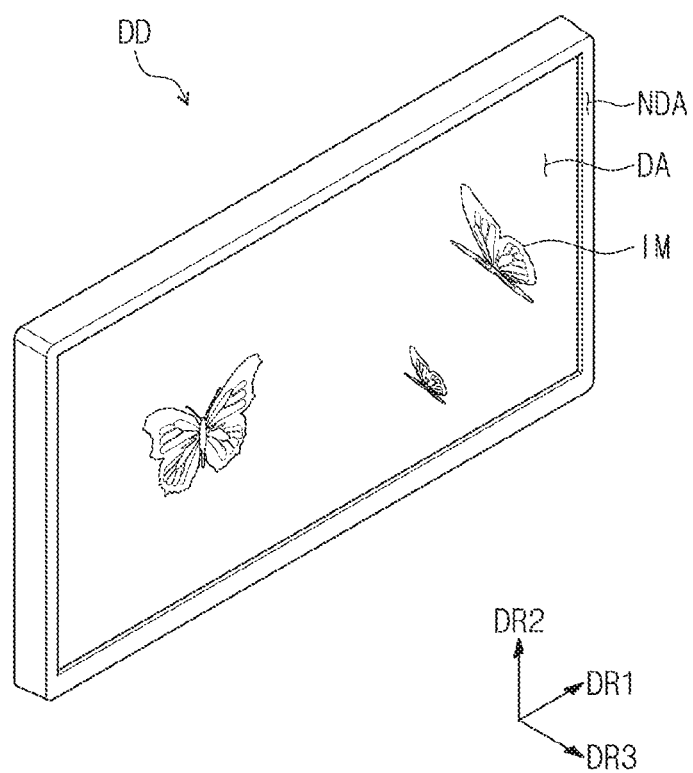
FIG. 1 is a perspective view of a display device according to an exemplary embodiment of the inventive concepts.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the DR1-axis, the DR2-axis, and the DR3-axis are not limited to three axes of a rectangular coordinate system, such as the x, y, and z-axes, and may be interpreted in a broader sense. For example, the DR1-axis, the DR2-axis, and the DR3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

As customary in the field, some exemplary embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some exemplary embodiments may be physically separated into two or more interacting and discrete blocks, units, and/or modules without departing from the scope of the inventive concepts. Further, the blocks, units, and/or modules of some exemplary embodiments may be physically combined into more complex blocks, units, and/or modules without departing from the scope of the inventive concepts.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

A front surface (or an upper surface) and a rear surface (or a lower surface) of each member or each part to be described below are distinguished by the third directional axis DR3. However, the first to third directional axes DR1, DR2, and DR3 shown is the embodiment are just exemplary, and the directions indicated by the first to third directional axes DR1, DR2, and DR3 are relative concepts and may thus be changed to other directions. Hereinafter, the first to third directions are directions respectively indicated by the first to third directional axes DR1, DR2, and DR3 and refer to the same reference numerals.

Figure 2:
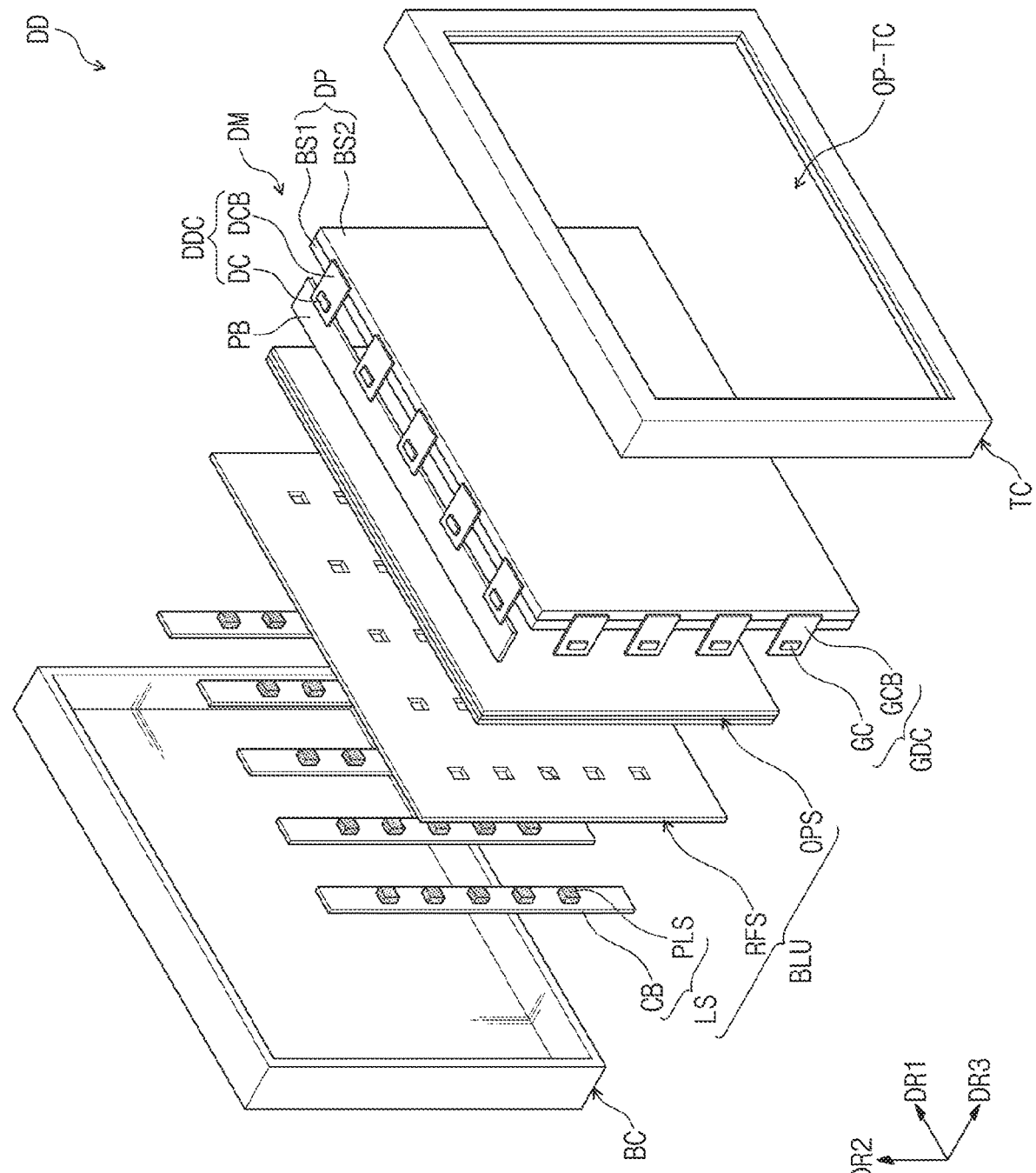
FIG. 2 is an exploded perspective view of the display device illustrated in FIG. 1.

FIG. 1 is a perspective view of a display device DD according to an exemplary embodiment of the inventive concepts. FIG. 2 is an exploded perspective view of the display device DD illustrated in FIG. 1.

As illustrated in FIGS. 1 and 2, the display device DD may include a top cover TC, a display panel DP, a main circuit board PB, gate driving parts GDC, data driving parts DDC, a backlight unit BLU, and a bottom member BC. The backlight unit BLU may include an optical member OPS, a reflection member RFS, and a light source LS.

Although not illustrated in the drawing, the display device DD may further include a bottom cover. The bottom cover is disposed in a lower portion of the bottom member BC, and may protect the display device DD from an external shock or contaminants.

As illustrated in FIG. 1, the display device DD includes a display area DA and a non-display area NDA. The display area DA may be provided on a plane parallel to a plane defined by a first direction DR1 and a second direction DR2 perpendicular to the first direction DR1. The non-display area NDA may be defined by the top cover TC. The non-display area NDA corresponds to the bezel of the display device DD.

In another exemplary embodiment of the inventive concepts, the top cover TC may be omitted. For the display device DD without the top cover TC, the non-display area NDA may be defined by a sealing member or mold, etc.

The display area DA provides image (IM) information to a consumer. In FIG. 1, is a butterfly is illustrated as an example of the image IM.

The top cover TC may protect the display panel DP or the like from an external shock or contaminants. An opening part OP-TC of the top cover TC exposes a front surface of the display panel DP to define the display area DA.

The display panel DP may include a first base substrate BS1 and a second base substrate BS2 configured to face the first base substrate BS1. The first base substrate BS1 and the second base substrate BS2 may be provided with a glass substrate or a plastic substrate, but are not limited thereto, and may include various materials that may be curved or folded. The base substrate may be referred to as a base member.

The display panel DP is parallel to a surface defined by the first direction DR1 and the second direction DR2. A normal direction of the display panel DP is indicated by a third direction DR3. The third direction DR3 indicates a thickness direction of the display device. A front surface and a rear surface of each member are classified by the third direction DR3. However, directions indicated by the first to third directions DR1, DR2, and DR3 are relative concepts, and may be changed to other directions.

According to an exemplary embodiment of the inventive concepts, the display panel DP may be provided with any one of an organic light emitting display panel, a liquid crystal display panel, a plasma display panel, an electrophoretic display panel, a microelectromechanical system (MEMS) display panel, and an electrowetting display panel.

In FIGS. 1 and 2, the display panel DP is exemplarily illustrated in a plane type, but exemplary embodiments of the inventive concepts are not limited thereto. In another exemplary embodiment of the inventive concepts, the display panel DP may be curved with a prescribed curvature.

The optical member OPS may include at least one of a diffuser, a first prism sheet (or a horizontal prism sheet), a second prism sheet (or a vertical prism sheet), or a luminance enhancement member.

The diffuser may diffuse and provide incident light to the display panel DP. The diffuser may have a plate shape or a sheet shape. The first prism sheet may adjust an oriented direction of the incident light to the first direction DR1. The second prism sheet may adjust the oriented direction of the incident light to the second direction DR2 orthogonal to the first direction DR1.

However, the type of the optical member OPS is not limited thereto, and may be a sheet for changing or enhancing the characteristics of the incident light.

The light source LS provides light to the display panel DP. The light source LS may include a plurality of point light sources PLS and a plurality of circuit boards CB.

Each of the point light sources PLS may include an LED chip and a lens. The LED chip may be mounted in the circuit board CB, and emits light in the visible wavelength band of about 430 nm to about 780 nm. The lens may control the direction of the light emitted from the LED chip.

The reflection member RFS may be disposed between the lens and the circuit boards CB. The reflection member RFS may reflect the light emitted through the lens after being generated by the LED chip.

In an exemplary embodiment of the inventive concepts, the reflection member RFS may have the sheet shape with the thickness of several micrometers to hundreds of micrometers. In another embodiment, the reflection member RFS may have the shape coated on the bottom member BC.

Although not illustrated, a plurality of optical member supporters may be disposed on the reflection member RFS. The optical member supporters may support the optical member OPS.

In FIG. 2, the backlight unit BLU is illustrated as having a direct-type structure, but is not limited thereto. In another exemplary embodiment of the inventive concepts, the backlight unit BLU may have an edge-type structure including a light guide member. The display module DM includes the display panel DP, the main circuit board PB, the gate driving parts GDC with gate circuit board GCB and gate driving chip GC, and the data driving parts DDC with data circuit board DCB and data driving chip DC.

Although not illustrated, when the display panel DP of display module DM is an organic light emitting display panel DP, the backlight unit BLU is omitted in the display device DD.

Figure 3A:
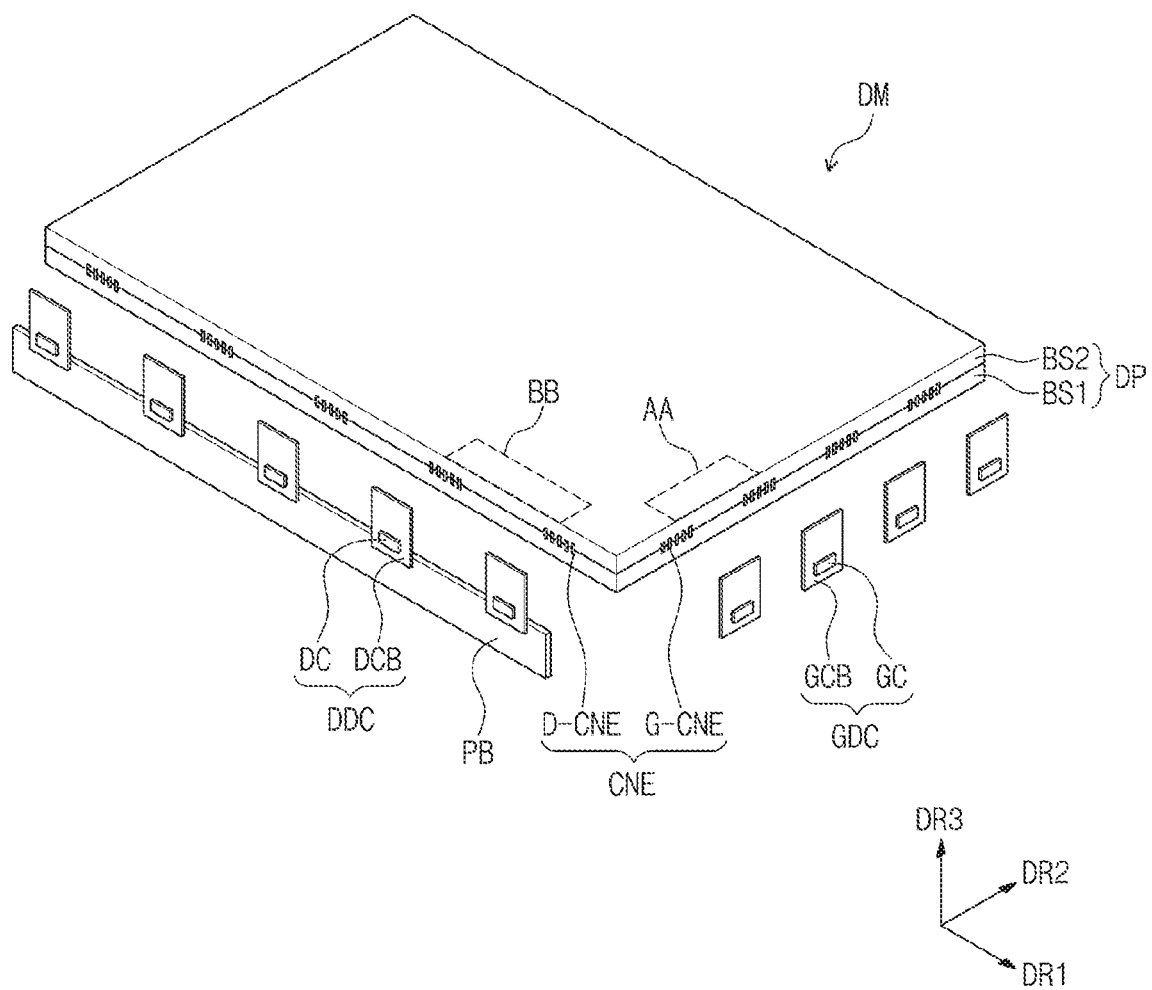
FIG. 3A is an exploded perspective view of a display module illustrated in FIG. 2.
Figure 3B:
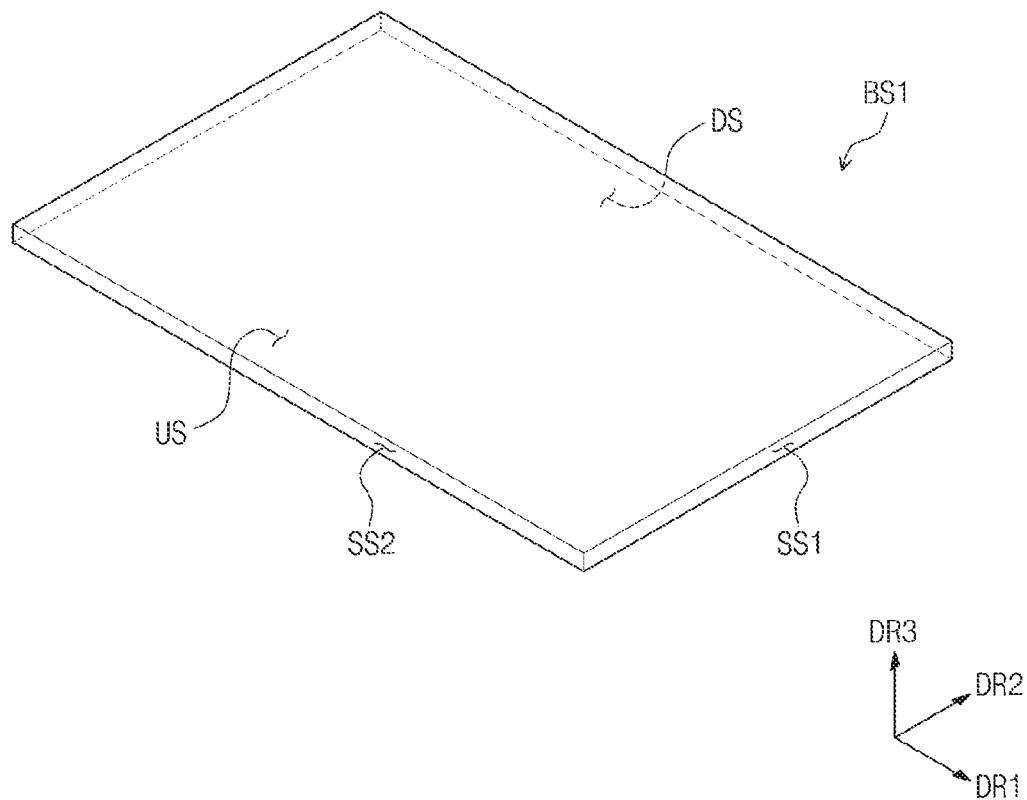
FIG. 3B is a perspective view of a first base substrate illustrated in FIG. 3A.
Figure 4:
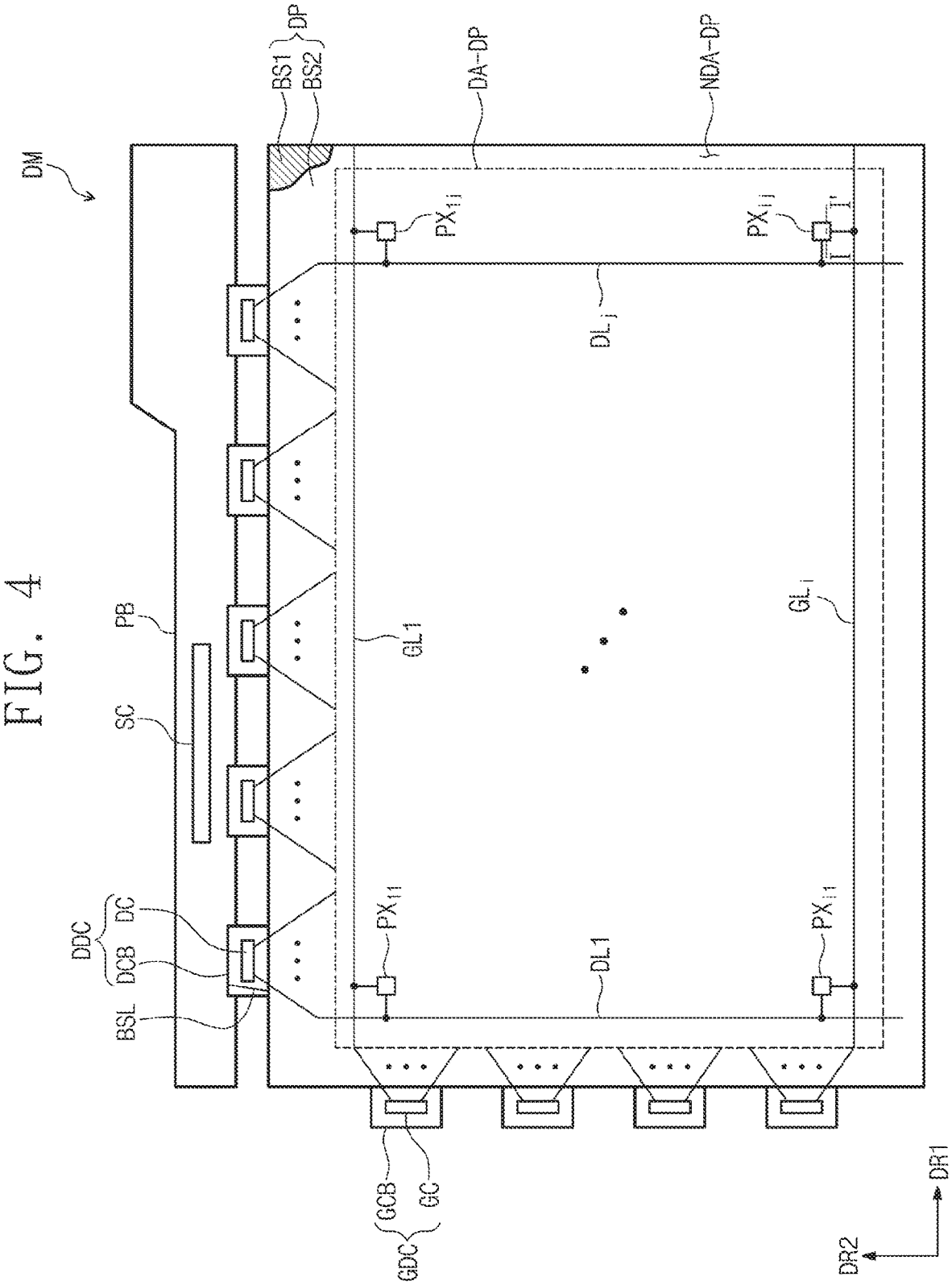
FIG. 4 is a block diagram of a display module according to an exemplary embodiment of the inventive concepts.

FIG. 3A is an exploded perspective view of the display module DM illustrated in FIG. 2. FIG. 3B is a perspective view of the first base substrate BS1 illustrated in FIG. 3A. FIG. 4 is a cross-sectional view of the display module DM according to an exemplary embodiment of the inventive concepts.

In relation to FIG. 3A, the display module DM includes a display panel DP, a main circuit board PB, gate driving parts GDC, data driving parts DDC, and connection electrodes CNE. The connection electrodes CNE include gate connection electrodes G-CNE and data connection electrodes D-CNE.

One side surface of the first base substrate BS1 may face a gate circuit board GCB of the gate driving part GDC, and another side surface of the first base substrate BS1 may face a data circuit board DCB of the data driving part DDC.

The connection electrode CNE may include a metal such as aluminum (Al), silver (Ag), copper (Cu), molybdenum (Mo), chromium (Cr), tantalum (Ta), or titanium (Ti), or an alloy thereof. In particular, as a scheme for providing the connection electrode CNE in each of side surface of the first base substrates BS1, a scheme for providing an electrode through laser patterning after deposition of a metal material, a silk screen scheme, or the like may be adopted in various manners.

An adhesive member (not shown) may electrically bond the gate connection electrodes G-CNE and gate driving pads (not shown) of the gate circuit board GCB. In addition, the adhesive member may electrically bond the data connection electrodes D-CNE and data driving pads (not shown) of the data circuit board DCB. According to an exemplary embodiment of the inventive concepts, the adhesive member may be provided with an anisotropic conductive film. When the anisotropic conductive film is used as the adhesive member, the adhesive member includes an adhesive film having adhesive property and conductive particles provided in the adhesive film. The conductive particles make the gate connection electrode G-CNE and the gate driving pads electrically conductive, and the data connection electrodes D-CNE and the data driving pads electrically conductive.

In relation to FIG. 3B, the first base substrate BS1 includes an upper surface US, a lower surface DS, and a plurality of side surfaces SS1 and SS2 configured to connect the upper surface US and the lower surface DS. In FIG. 3B, as examples of the plurality of side surfaces SS1 and SS2, a first side surface SS1 and a second side surface SS2 are shown.

In relation to FIG. 4, the display panel DP, which includes the first base substrate BS1 and the second base substrate BS2, includes a display area DA-DP and a non-display area NDA-DP adjacent to the display area DA-DP. According to an exemplary embodiment of the inventive concepts, the non-display area NDA-DP is illustrated to surround the display area DA-DP, but is not limited thereto. The non-display area DP-NDA may be adjacent to one side of the display area DP-DA or omitted.

In the present specification, a first part or a center area may be used as a meaning corresponding to the display area DA. In the present specification, a bezel area, a second part, or an edge area may be used as a meaning corresponding to the non-display area NDA.

The first base substrate BS1 includes a plurality of gate lines $GL_1$ to $GL_i$, a plurality of data lines $DL_1$ to $DL_j$ configured to intersect with the gate lines $GL_1$ to $GL_i$, and a plurality of pixels $PX_{11}$ to $PX_{ij}$ connected to the gate lines $GL_1$ to $GL_i$ and the data lines $DL_1$ to $DL_j$. The gate lines $GL_1$ to $GL_i$ are connected to the gate driving parts GDC. The data lines $DL_1$ to $DL_j$ are connected to data driving parts DDC. On the other hand, FIG. 4 only illustrates 4 parts of the gate lines $GL_1$ to $GL_i$, the data lines $DL_1$ to $DL_j$, and pixels $PX_{11}$ to $PX_{ij}$.

The pixels $PX_{11}$ to $PX_{ij}$ may be classified into a plurality of groups according to a color to be displayed. In other words, the pixels $PX_{11}$ to $PX_{ij}$ may display one of primary colors. The primary colors may include green, blue, and white. On the other hand, the primary colors are not limited thereto, and may further include various colors such as yellow, cyan, and magenta.

The signal control part SC is mounted in the main circuit board PB and outputs overall driving signals necessary to drive the display panel DP. As an example, in response to an external control signal, the signal control part SC generates gate control signals for controlling the gate driving parts GDC and transfers the gate control signals the gate driving parts GDC. In response to an external control signal, the signal control part SC generates data control signals for controlling the data driving parts DDC and transfers the data control signals to the data driving parts DDC.

The gate driving parts GDC generate the gate signals on the basis of the gate control signals during a plurality of frame periods. The gate driving parts GDC output the gate signals to the gate lines. The gate signals may be sequentially output in correspondence to horizontal periods. In addition, although not illustrated, a plurality of gate circuit boards GCB may be electrically connected to each other.

On the other hand, it is described that the gate driving parts are provided in plurality, but is not limited thereto. In other words, the gate driving part GDC may be provided as a single gate driving part GDC to generate the gate signals. For example, the display module DM including one single gate driving part GDC may be applied to a mobile phone, etc.

Each of the gate driving parts GDC may include a gate driving chip GC and a gate circuit board GCB with the gate driving chip GC mounted thereon. The gate circuit board GCB may be provided with a flexible printed circuit board, and may be provided as many as the number corresponding to the number of the gate driving chips GC.

The data driving part DDC generates grayscale voltages according to image data provided from the signal control part SC on the basis of the data control signal received from the signal control part SC. The data driving parts DDC output the grayscale voltages to the data lines $DL_1$ to $DL_j$ as data signals.

On the other hand, it is described that the plurality of the data driving parts are provided, but is not limited thereto. In other words, the data driving part DDC is provided as a single data driving part to generate the grayscale voltages. For example, the display module DM including one single gate driving part GDC may be applied to a mobile phone, etc.

Each of the data driving parts DDC may include a data driving chip DC and a data circuit board DCB with the data driving chip DC mounted thereon. The data circuit board DCB may be provided with a flexible printed circuit board. The data circuit board DCB electrically connects the main circuit board PB and the first base substrate BS1. The data driving chip DC is electrically connected to corresponding data lines among the plurality of data lines $DL_1$ to $DL_j$.

The gate control signal output from the signal control part SC may be provided to the gate circuit board GCB via the data circuit board most adjacent to the gate circuit board GCB from among the data circuit boards DCB. To this end, the data circuit board DCB may include an auxiliary dummy line BSL configured to transfer the gate control signal output from the signal control part SC to the gate circuit board GCB.

According to an exemplary embodiment of the inventive concepts, the gate driving parts GDC may be disposed on one side surface of the first base substrate BS1 and one side surface of the second base substrate BS2 aligned with the one side surface of the first base substrate BS1. The gate driving parts GDC and the data driving parts DDC may be provided in a tape carrier package (TCP) type.

According to an exemplary embodiment of the inventive concepts, the data driving parts DDC may be disposed on another side surface of the first base substrate BS1 and another side surface of the second base substrate BS2 aligned with the other side surface of the first base substrate BS1. The gate driving parts GDC and the data driving parts DDC may be provided in a tape carrier package (TCP) type.

Figure 5:
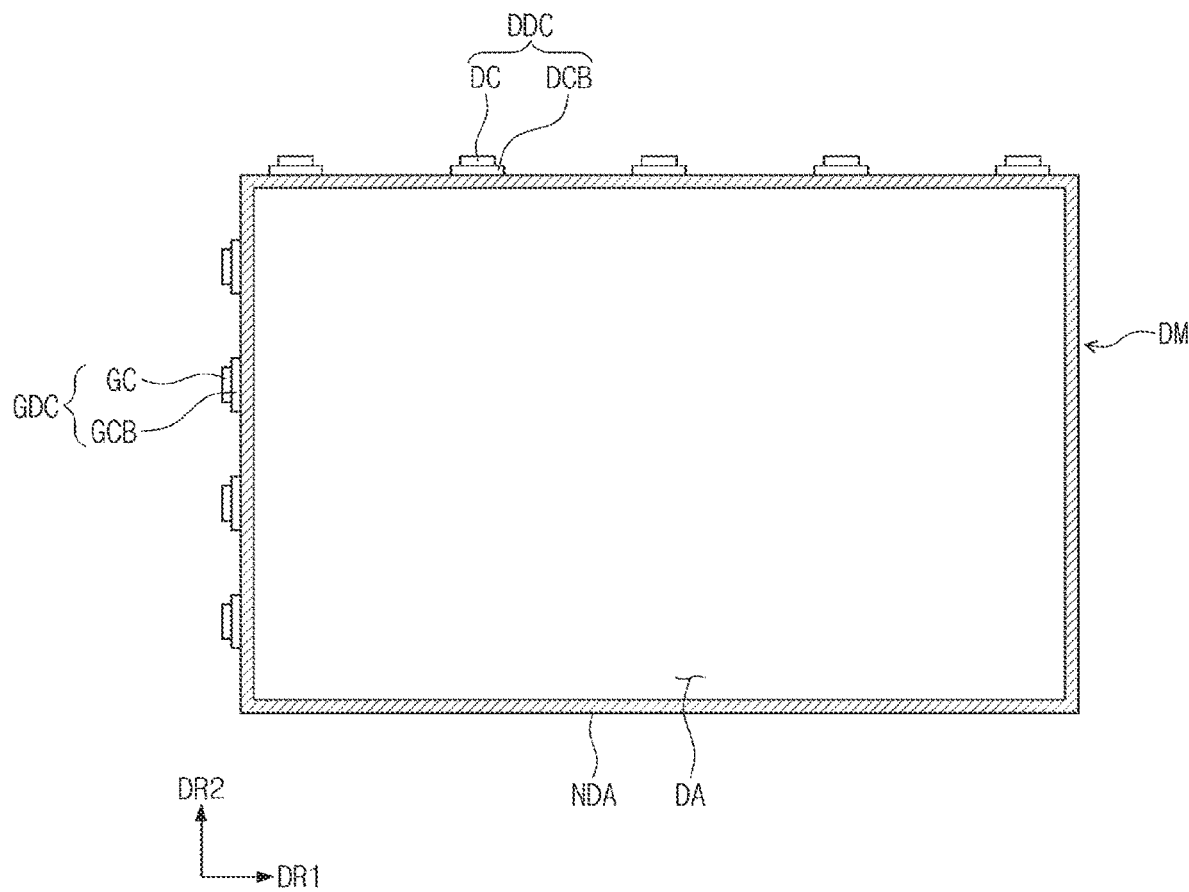
FIG. 5 is a plan view of the display module according to an exemplary embodiment of the inventive concepts.

FIG. 5 is a plan view of the display module DM according to an exemplary embodiment of the inventive concepts.

In relation to FIG. 5, the gate driving parts GDC and the data driving parts DDC may be respectively disposed on one side surface and another side surface of the display panel DP. Here, the one side surface and the other side surface of the display panel DP may respectively correspond to the one side surface and the other side surface of the first base substrate BS1 or the second base substrate BS2.

When the gate driving parts GDC and the data driving parts DDC are not disposed on the side surfaces but on an upper surface of the first base substrate BS1, a pad part electrically connected to the gate driving parts GDC and the data driving parts DDC is disposed on the upper surface of the first base substrate BS1. As the pad part is disposed on the upper surface of the first base substrate BS1, the bezel area NDA may increase as large as the area of the pad part.

However, according to an exemplary embodiment of the inventive concepts, as described above, as the gate circuit board GCB is disposed on the side surface of the display panel DP, the pad part is not disposed on the upper surface of the first base substrate BS1. As a result, the non-display area NDA may be reduced in correspondence to the area of the pad part.

Figure 6:
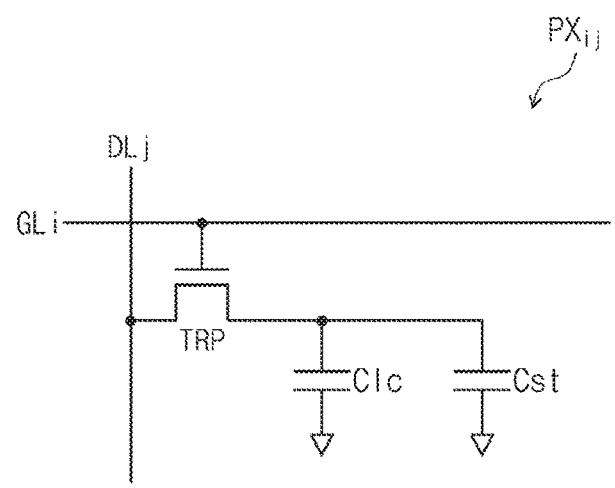
FIG. 6 is an equivalent circuit diagram according to an exemplary embodiment of the inventive concepts.
Figure 7:
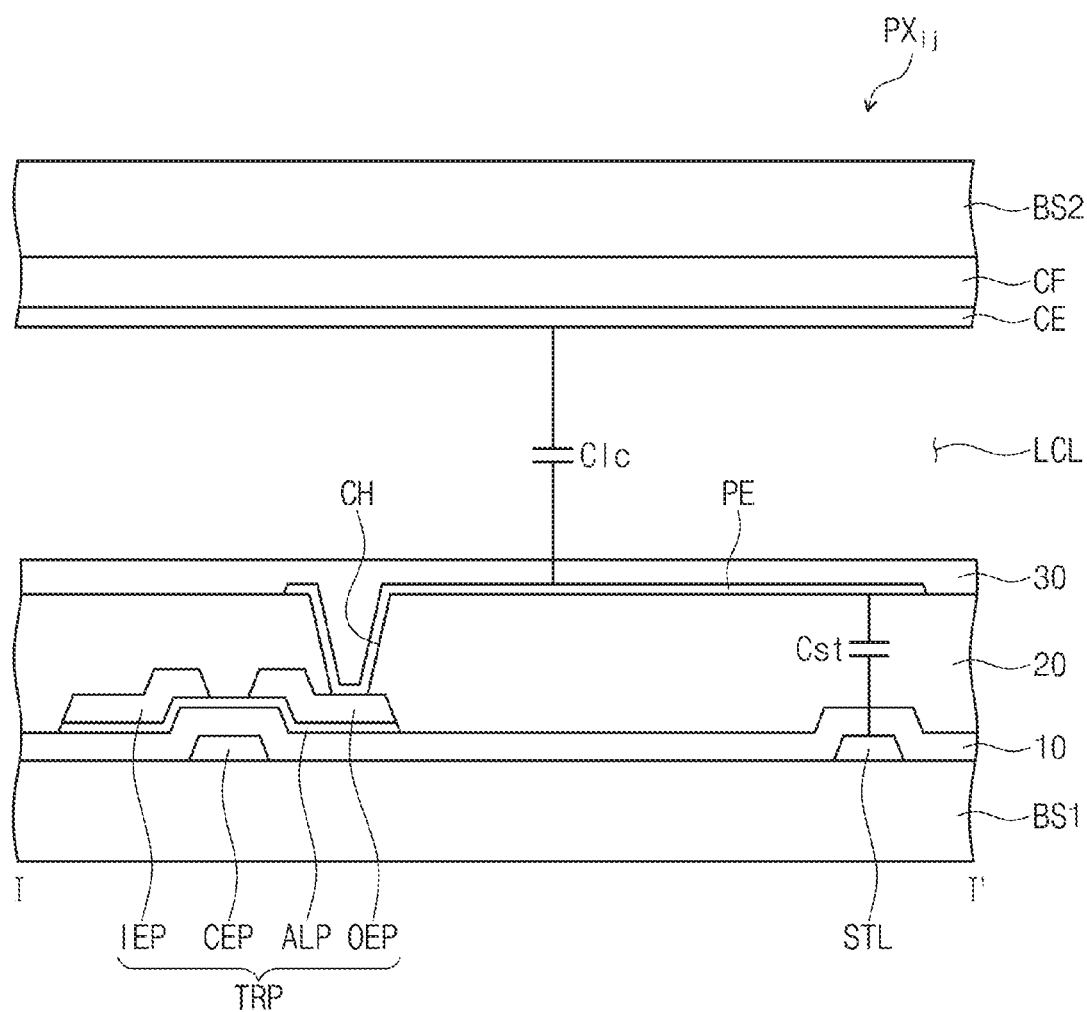
FIG. 7 is a cross-sectional view cut along line I-I' illustrated in FIG. 4.

FIG. 6 is an equivalent circuit diagram of a pixel $PX_{ij}$ according to an exemplary embodiment of the inventive concepts. FIG. 7 is a cross-sectional view cut along I-I' of the pixel $PX_{ij}$ according to an exemplary embodiment of the inventive concepts.

Each of the plurality of pixels $PX_{11}$ to $PX_{ij}$ illustrated in FIG. 4 may have an equivalent circuit to that illustrated in FIG. 6.

As illustrated in FIG. 6, a pixel $PX_{ij}$ includes a pixel thin film transistor TRP (hereinafter, a pixel transistor), a liquid crystal capacitor Clc, and a storage capacitor Cst. In an exemplary embodiment of the inventive concepts, the storage capacitor Cst may be omitted.

A pixel transistor TRP is electrically connected to an ith gate line $GL_i$ and a jth data line $DL_j$. The pixel transistor TRP outputs a pixel voltage corresponding to a data signal received from the jth data line $DL_j$ in response to a gate signal received from the ith gate line $GL_i$.

A liquid crystal capacitor Clc is charged with the pixel voltage output from the pixel transistor TRP. According to a charge amount charged in the liquid crystal capacitor Clc, an arrangement of liquid crystal directors included in the liquid crystal layer LCL (see FIG. 9) is changed. Light incident to the liquid crystal layer is transmitted or blocked according to the arrangement of the liquid crystal directors.

The storage capacitor Cst is connected to the liquid crystal capacitor Clc in parallel. The storage capacitor Cst maintains the arrangement of the liquid crystal directors during a certain period.

As illustrated in FIG. 7, the pixel transistor TRP includes a control electrode CEP (hereinafter, a pixel control electrode) connected to the ith gate line $GL_i$ (see FIG. 4), an activation layer ALP (hereinafter, a pixel activation layer) configured to overlap the pixel control electrode CEP, an input electrode IEP (hereinafter, a pixel input electrode) connected to the jth data line $DL_j$ (see FIG. 2), and an output electrode OEP (hereinafter, a pixel output electrode) disposed separate from the pixel input electrode IEP.

The liquid crystal capacitor Clc includes a pixel electrode PE and a common electrode CE. The storage capacitor Cst includes the pixel electrode and a part of a storage line STL configured to overlap the pixel electrode PE.

The ith gate line $GL_i$ and the storage line STL are disposed on one side of the first base substrate BS1. The pixel control electrode CEP is branched from the ith gate line $GL_i$. The ith gate line $GL_i$ and the storage line STL may include a metal such as aluminum (Al), silver (Ag), copper (Cu), molybdenum (Mo), chromium (Cr), tantalum (Ta), or titanium (Ti), or an alloy thereof. The ith gate line $GL_i$ and the storage line STL may include a multilayer structure of, for example, a titanium layer and a copper layer.

A first insulation layer 10 provided to cover the pixel control electrode CEP and the storage line STL is disposed on one surface of the first base substrate BS1. The first insulation layer 10 may include at least any one of an inorganic material and an organic material. The first insulation layer 10 may be an organic film or an inorganic film. The first insulation layer 10 may include a multilayer structure of, for example, a silicon nitride layer and a silicon oxide layer.

The pixel activation layer ALP configured to overlap the pixel control electrode CEP is disposed on the first insulation layer 10. The pixel activation layer ALP may include a semiconductor layer (not shown) and an ohmic contact layer (not illustrated).

The pixel activation layer ALP may include amorphous silicon or polysilicon. In addition, the pixel activation layer ALP may include a metal oxide semiconductor.

The pixel output electrode OEP and the pixel input electrode IEP are disposed on the pixel activation layer ALP. The pixel output electrode OEP and the pixel input electrode IEP are disposed separate from each other. Each of the pixel output electrode OEP and the pixel input electrode IEP may partially overlap the pixel control electrode CEP.

FIG. 7 illustrates an exemplary pixel transistor TRP having a staggered structure, but the structure of the pixel transistor TRP is not limited hereto. The pixel transistor TRP may have a planar structure.

A second insulation layer 20 provided to cover the pixel activation layer ALP, the pixel output electrode OEP, and the pixel input electrode IEP is disposed on the first insulation layer 10. The second insulation layer 20 provides a flat surface. The second insulation layer 20 may include an organic material.

The pixel electrode is disposed on the second insulation layer 20. The pixel electrode PE is connected to the pixel output electrode OEP through the second insulation layer 20 and a contact hole CH configured to penetrate through the second insulation layer 20. An alignment film 30 configured to cover the pixel electrode PE may be disposed on the second insulation layer 20.

A color filter layer CF is disposed on one surface of the second base substrate BS2. A common electrode is disposed on one surface of the color filter layer CF. A common voltage is applied to the common electrode CE. The common voltage and the pixel voltage have different values. An alignment film (not illustrated) configured to cover the common electrode CE may be disposed on the common electrode CE. Another insulation layer may be disposed between the color filter layer CF and common electrode CE.

The pixel electrode PE and the common electrode CE with a liquid crystal layer LCL interposed therebetween form the liquid crystal capacitor Clc. In addition, parts of the pixel electrode PE and storage line STL with the first and second insulation layers 10 and 20 interposed therebetween form the storage capacitor Cst. The storage line STL receives a storage voltage having a different value from the pixel voltage. The storage voltage may have the same value as the common voltage.

Furthermore, a cross section of a pixel $PX_{ij}$ illustrated in FIG. 7 is just exemplary. Unlike those illustrated in FIG. 9, at least one of the color filter layer CF and common electrode CE may be disposed on the first base substrate BS1. In other words, a liquid crystal display panel according to an exemplary embodiment of the inventive concepts may include a pixel in a mode such as a vertical alignment (VA) mode, patterned vertical alignment (PVA) mode, in-plane switching (IPS) mode, fringe-field switching (FFS) mode, or plane to line switching (PLS) mode.

Figure 8:
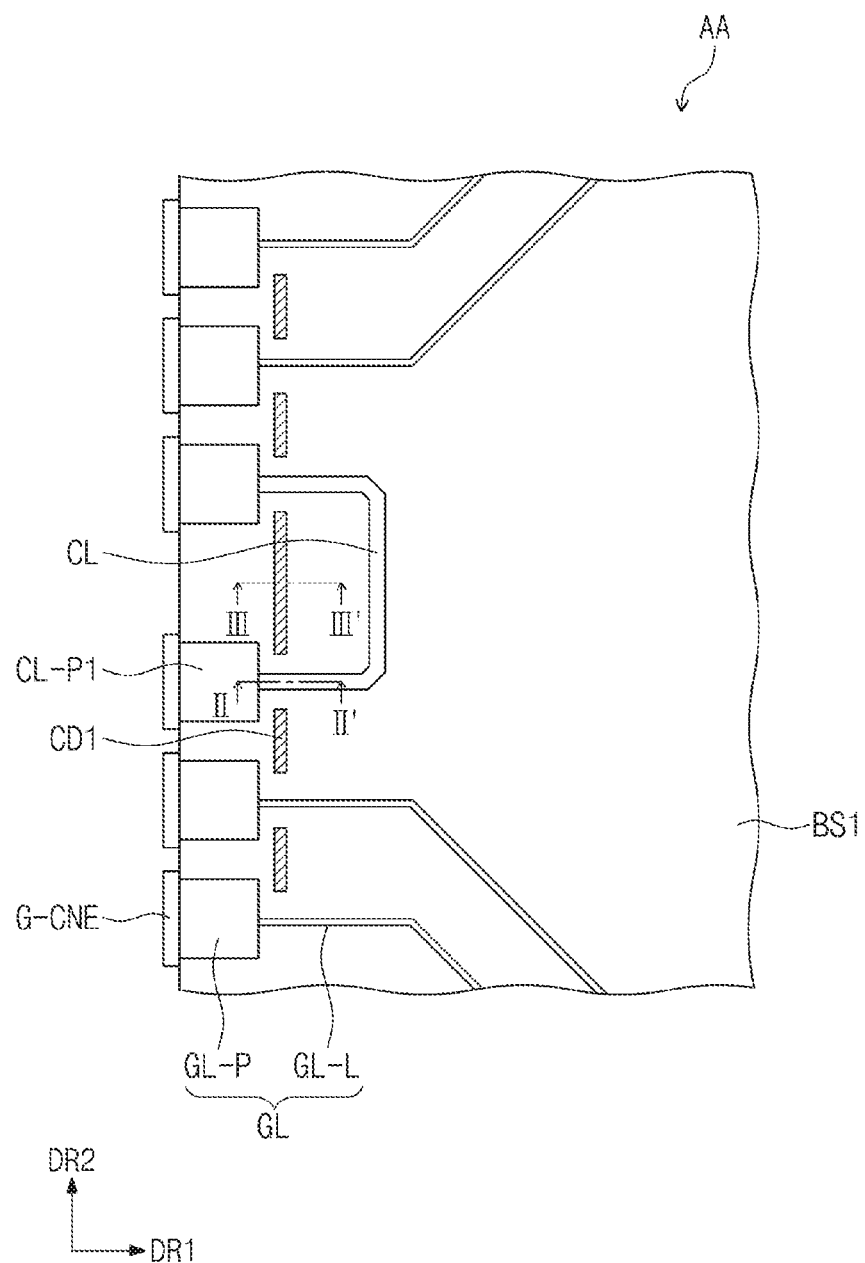
FIG. 8 is an enlarged plan view in which the first base substrate is enlarged in an area corresponding to area AA illustrated in FIG. 3A.
Figure 9:
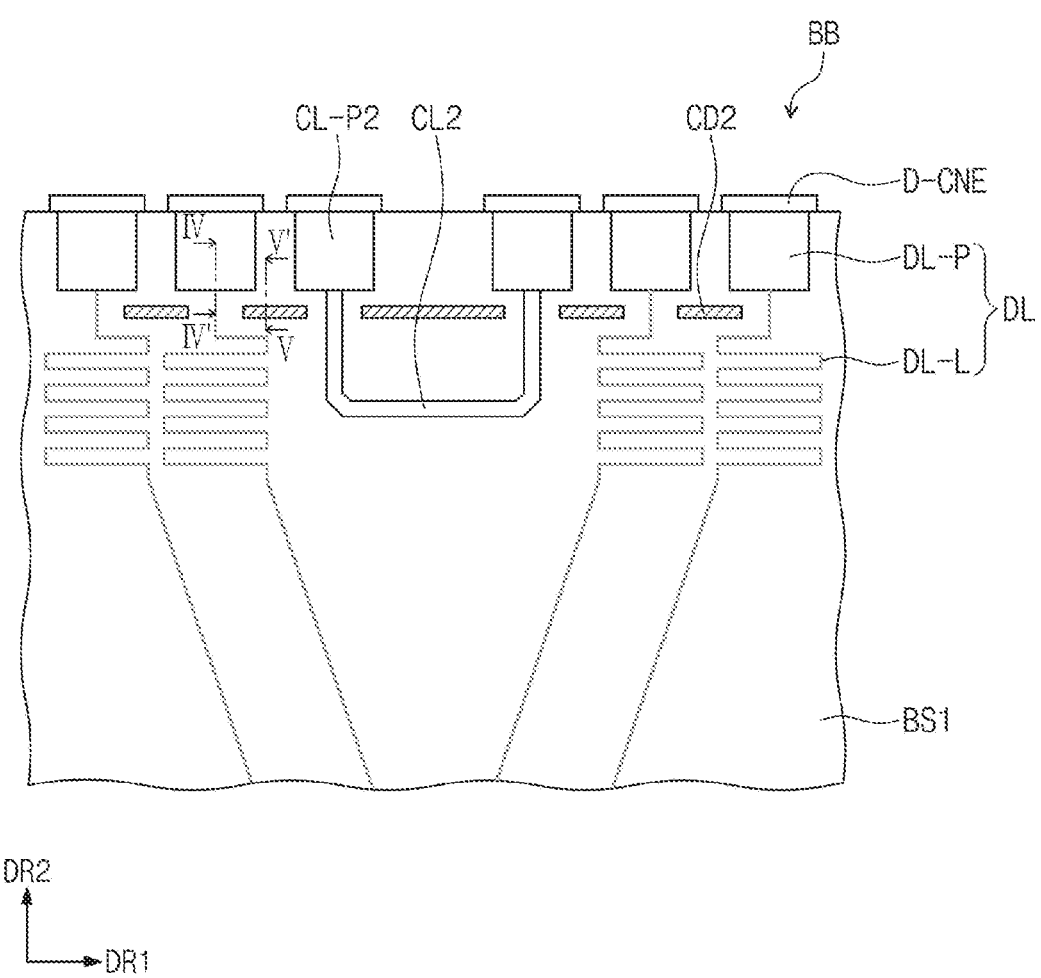
FIG. 9 is an enlarged plan view in which the first base substrate is enlarged in an area corresponding to area BB illustrated in FIG. 3A.

FIG. 8 is an enlarged plan view in which the first base substrate BS1 is enlarged in an area corresponding to area AA illustrated in FIG. 3A. FIG. 9 is an enlarged plan view in which the first base substrate BS1 is enlarged in an area corresponding to area BB illustrated in FIG. 3A.

FIGS. 8 and 9 may illustrate a part of an area corresponding to the non-display area NDA-DP of the display panel DP.

In relation to FIG. 8, the gate connection electrodes G-CNE may be disposed on a first side surface SS1 (see FIG. 3B) of the first base substrate BS1.

However, exemplary embodiments of the inventive concepts are not limited thereto, and in another exemplary embodiment of the inventive concepts, the data connection electrodes D-CNE may be disposed on the first side surface SS1.

Each of the gate connection electrodes G-CNE may be electrically connected to each gate line GL and receive an electrical signal. In the present specification, the gate line GL may be referred to as a signal transferring part.

The gate line GL may contact the gate connection electrode G-CNE and receive the electrical signal, and be disposed on the upper surface US of the first base substrate BS1 to be extended in the first direction DR1.

The gate line GL may include a gate pad part GL-P and a gate signal line part GL-L. The gate pad part GL-P may contact the gate connection electrode G-CNE and receive the electrical signal. In relation to FIG. 8, the gate pad part GL-P is extended shorter in comparison with the gate connection electrode G-CNE in the second direction DR2. However, exemplary embodiments of the inventive concepts are not limited thereto, and the gate pad part GL-P may be extended longer than the gate connection electrode G-CNE.

The gate signal line part GL-L is extended from the gate pad part GL-P, and may have a smaller width than the gate pad part GL-P in the second direction DR2.

In an exemplary embodiment of the inventive concepts, in order to electrically connect the gate driving parts GDC (see FIG. 3A) to each other, a connection pad CL-P1 may be disposed on the upper surface US of the first base substrate BS1. The connection pad CL-P1 is connected to an adjacent other connection pad CL-P1 via a connection line CL1 and becomes electrically conductive.

In an exemplary embodiment of the inventive concepts, each of first blocking pads CD1 may overlap the non-display area NDA-DP of the first base substrate BS1, and be disposed between two adjacent gate lines GL.

The first blocking pads CD1 may be disposed separate from the gate line GL. However, exemplary embodiments of the inventive concepts are not limited thereto. Although not illustrated, each of the first blocking pads CD1 may contact any one of two adjacent gate lines GL and have an integrated shape with the contacted gate line GL.

The first blocking pad CD1 may be disposed and insulated from the gate line GL, and extended in the second direction DR2.

In an exemplary embodiment of the inventive concepts, a part of the first blocking pads CD1 may be disposed between two adjacent gate signal line parts GL-L.

When the width of the gate signal line part GL-L is smaller than that of the gate pad part GL-P, at least a part of the first blocking pad CD1 may overlap at least a part of the gate pad part GL-P in the first direction DR1.

In an exemplary embodiment of the inventive concepts, a part of the first blocking pads CD1 may be disposed between two adjacent connection pads CL-P1 or two facing parts of a connection line CL1.

In an exemplary embodiment of the inventive concepts, the gate connection electrodes G-CNE may be disposed separate from each other. In a manufacturing process of the gate connection electrodes G-CNE, first, electrodes may be printed in a paste type on one side surface of the display panel DP to which each of the gate driving parts GDC corresponds. After curing the printed electrode, each gate connection electrode G-CNE may be manufactured using a laser patterning scheme.

When the gate connection electrode G-CNE is manufactured using the laser patterning scheme, there has not been a typical separate blocking member, and thus laser light may pass through a panel that is not blocked by the gate pad part GL-P. In this case, the inside structure of the panel, such as a wiring part including the gate signal line part GL-L and the connection line CL1 inside the display panel DP, and the first base substrate BS1 may be damaged. Accordingly, a defect such as open-circuit or backlight bleeding occurs, the damaged structure causes an external air or moisture to permeate through the damaged structure, and heat generated during operation of the display device DD rapidly corrodes the inside of the panel, which results in poor durability.

However, in an exemplary embodiment of the inventive concepts, each of the first blocking pads CD1 may be disposed between the gate lines GL, the connection pads CL-P1, and the connection line CL1. Accordingly, although a laser is irradiated in order to manufacture the gate connection electrodes G-CNE, the laser light is blocked, and thus damage to the panel and the wiring may be prevented or reduced. Accordingly, even in an environment in which an air and moisture permeate, or in a high temperature environment, high durability may still be achieved.

In relation to FIG. 9, the data connection electrodes D-CNE may be disposed on the second side surface SS2 (see FIG. 3B) of the first base substrate BS1.

Each of the data connection electrodes D-CNE may be electrically connected to each data line DL and receive an electrical signal. In the present specification, the data line DL may be referred to as a signal transferring part.

The data line DL may contact the data connection electrode D-CNE and receive the electrical signal, and be disposed on the upper surface of the base substrate BS1 to be extended in the second direction DR2.

The data line DL may include a data pad part DL-P and a data signal line part DL-L. The data pad part DL-P may contact the data connection electrode D-CNE and receive the electrical signal. In relation to FIG. 9, the data pad part DL-P is extended shorter in comparison with the data connection electrode D-CNE in the second direction DR2. However, exemplary embodiments of the inventive concepts are not limited thereto, and the data pad part DL-P may be extended longer than the data connection electrode D-CNE.

The data signal line part DL-L is extended from the data pad part DL-P, and may have a smaller width than the data pad part DL-P in the first direction DR1. At least a part of each of the data signal line parts DL-L adjacent to the data pad part DL-P may have a winding shape in order to have substantially the same resistance value as other data signal line parts DL-L.

In an exemplary embodiment of the inventive concepts, in order to electrically connect the data driving parts DDC (see FIG. 3B), a connection pad CL-P2 may be disposed on the upper surface US of the first base substrate BS1. The connection pad CL-P2 is connected to an adjacent other connection pad CL-P2 via a connection line and becomes electrically conductive.

In an exemplary embodiment of the inventive concepts, each of second blocking pads CD2 may overlap the second part NDA of the first base substrate BS1, and be disposed between two adjacent data lines DL. The second blocking pad CD2 may be extended in the first direction DR1.

Here, for the description about the second blocking pad, substantially the same content as the description about the first blocking pad may be applied, and thus detailed descriptions thereabout will be omitted below. When substantially the same content is applied, the gate line GL, the gate pad part GL-P, and the gate signal line part GL-L may correspond respectively to the data line DL, the data pad part DL-P, and the data signal ling part DL-L, and the connection pad CL-P2 and the connection line CL2 may correspond respectively to the connection pad CL-P1 and the connection line CL1.

When the data connection electrode D-CNE is manufactured using the laser patterning scheme, there has not been a typical separate blocking member and thus laser light may pass through a panel that is not blocked by the data pad part DL-P.

In this case, the inside structure of a panel, such as a wiring part including the data signal line part DL-L and the connection line CL2 inside the display panel DP, and the first base substrate BS1 may be damaged. Accordingly, a defect such as open-circuit or backlight bleeding occurs, the damaged structure causes an external air or moisture to permeate through the damaged structure, and heat generated during operation of the display device DD rapidly corrodes the inside of the panel, which results in poor durability.

However, in an exemplary embodiment of the inventive concepts, the second connection pad CD2 is disposed among the data lines DL, the connection pads CL-P2, and the connection line CL2. Accordingly, although laser is irradiated in order to manufacture the data connection electrode D-CNE, the laser light is blocked and thus damage to the panel and the wiring may be prevented or reduced. Accordingly, even in an environment in which an air and moisture permeate, or in a high temperature environment, high durability may be achieved.

Figure 10A:
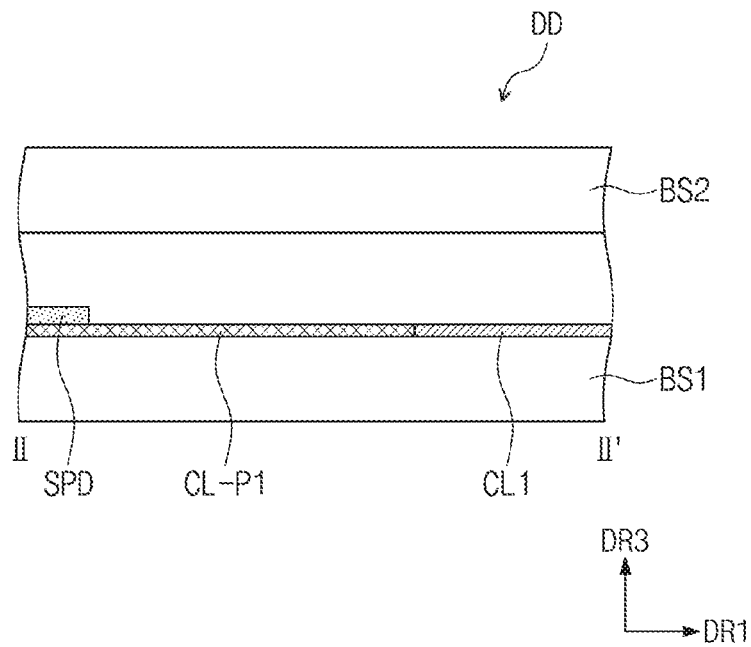
FIG. 10A is a cross-sectional view cut along line II-II' illustrated in FIG. 8.
Figure 10B:
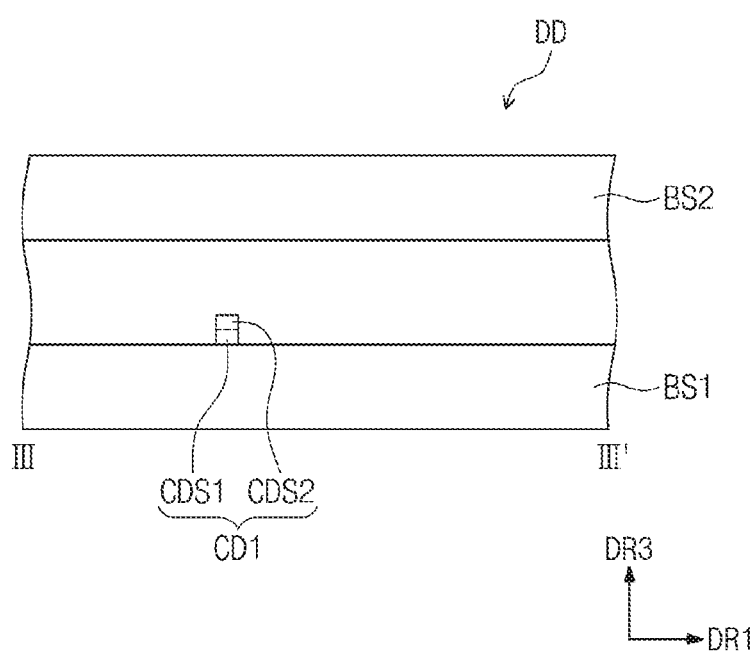
FIG. 10B is a cross-sectional view cut along line III-III' shown in FIG. 8.

FIG. 10A is a cross-sectional view cut along line II-II' illustrated in FIG. 8. FIG. 10B is a sectional view cut along line III-III' shown in FIG. 8.

In relation to FIG. 10A, the connection pad CL-P1 and the connection line CL1 extended from the connection pad CL-P1 may be disposed on the upper surface of the first base substrate BS1. An auxiliary electrode SPD may be disposed on the connection pad CL-P1. Since the auxiliary electrode is disposed and thus a surface on which the connection pad CL-P1 and the gate connection electrode G-CNE contact each other become substantially wider, an electrical signal transmitted from the gate connection electrode G-CNE may be transferred better.

According to the drawing, the auxiliary electrode SPD does not completely overlap the connection pad CL-P1, when viewed from the third direction DR3. However, exemplary embodiments are not limited thereto, and the auxiliary electrode SPD may be disposed to completely overlap the connection pad CL-P1, when viewed from the third direction DR3.

In relation to FIG. 10B, the first blocking pad CD1 is disposed between parts of the connection line CL (see FIG. 10A).

In relation to FIGS. 7 and 10B, at least a part of the first blocking pad CD1 may be disposed on the same layer as at least any one of the control electrode CEP, the input electrode IEP, and the output electrode OEP. At least a part of the first blocking pad CD1 may be provided with the same material as at least any one of the control electrode CEP, the input electrode IEP, and the output electrode OEP. The first blocking pad CD1 may include a first sub-blocking pad CDS1 provided in the same process as the control electrode CEP, and a second sub-blocking pad CDS2 provided in the same process as the input electrode IEP and the output electrode OEP. The first sub-blocking pad CDS1 may include the same material as the control electrode CEP, and the second sub-blocking pad CDS2 may include the same material as at least any one of the input electrode IEP and the output electrode OEP.

When the first blocking pad CD1 is manufactured in the same process using the same material as other structures of the display device DD, an additional process and cost may not be incurred. However, exemplary embodiments of the inventive concepts are not limited thereto, and various materials capable of blocking laser light adoptable by a person skilled in the art may be included.

The first sub blocking pad CDS1 may have substantially the same height as the gate pad part GL-P, and the second sub blocking pad CDS2 may have substantially the same height as the auxiliary electrode SPD. In this way, the first blocking pad CD1 is provided with two layers, and thus other wiring parts having the height equal to or lower than the height of the first blocking pad CD1 may be effectively protected from laser light generated in the laser patterning process.

Figure 11A:
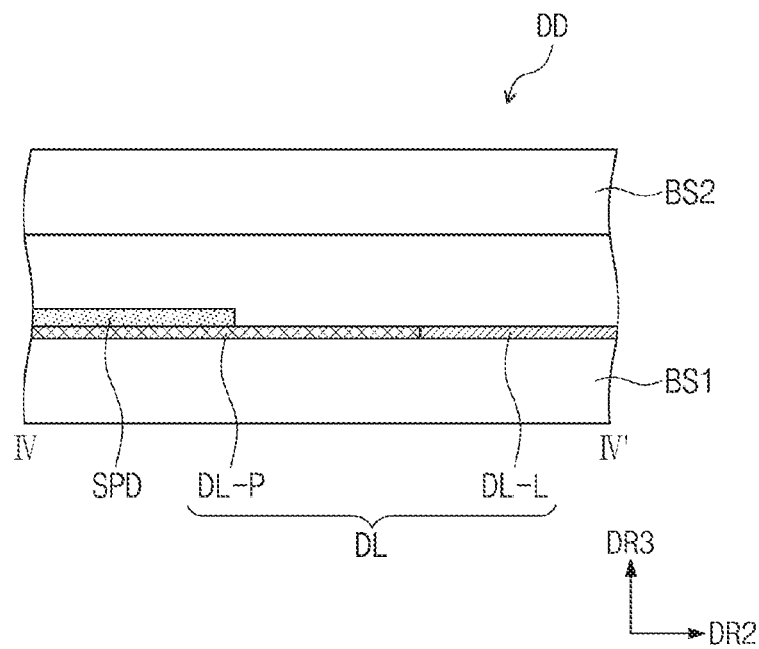
FIG. 11A is a cross-sectional view cut along line IV-IV' illustrated in FIG. 9.
Figure 11B:
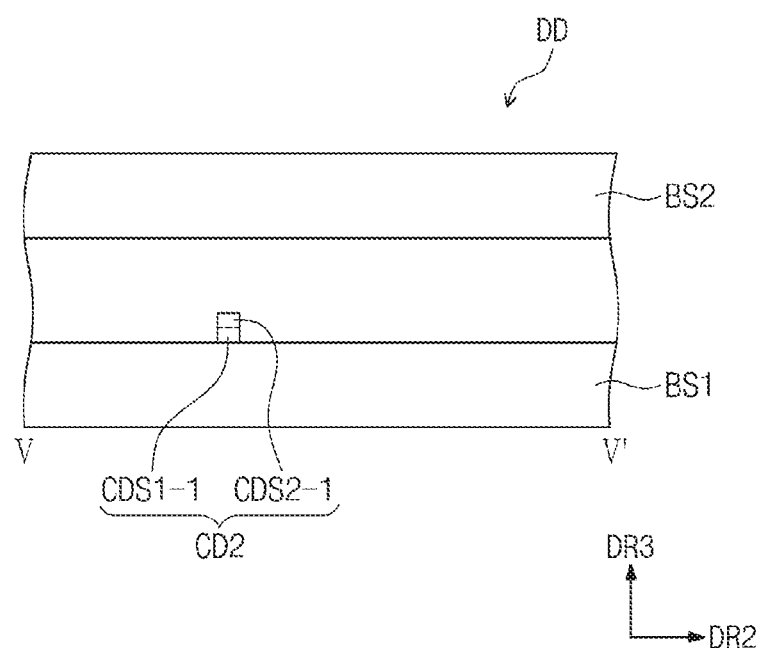
FIG. 11B is a cross-sectional view cut along line V-V' illustrated in FIG. 9.

FIG. 11A is a cross-sectional view cut along line IV-IV' illustrated in FIG. 9. FIG. 11B is a cross-sectional view cut along line V-V' illustrated in FIG. 9.

In relation to FIG. 11A, the data pad part DL-P and the data signal line part DL-L extended from the data pad part DL-P may be disposed on the upper surface of the first base substrate BS1. An auxiliary electrode SPD may be disposed on the data pad part DL-P. Since the auxiliary electrode SPD is disposed, a surface on which the data pad part DL-P and the data connection electrode D-CNE contact each other becomes substantially wider, and accordingly, an electrical signal transmitted from the data connection electrode D-CNE may be transferred better.

As illustrated in the drawing, the auxiliary electrode SPD does not completely overlap the data pad part DL-P, when viewed from the third direction DR3. However, the exemplary embodiments are not limited thereto, and the auxiliary electrode SPD may be disposed to completely overlap the data pad part DL-P, when viewed from the third direction DR3.

In relation to FIG. 11B, the second blocking pad CD2 is disposed between the plurality of data lines DL.

In relation to FIGS. 7 and 11B, according to an exemplary embodiment of the inventive concepts, at least a part of the second blocking pad CD2 may be disposed on the same layer as at least any one of the control electrode CEP (see FIG. 7), the input electrode IEP (see FIG. 7), and the output electrode OEP (see FIG. 7). At least a part of the second blocking pad CD2 may be provided with the same material as at least any one of the control electrode CEP, the input electrode IEP, and the output electrode OEP. The second blocking pad CD2 may include the second sub-blocking pad CDS2-1 provided in the same process as the control electrode CEP, and the second sub-blocking pad CDS2-1 provided in the same process as the input electrode IEP and the output electrode OEP. The first sub-blocking pad CDS1-1 may include the same material as the control electrode CEP, and the second sub-blocking pad CDS2-1 may include the same material as at least any one of the input electrode IEP and the output electrode OEP.

When the second blocking pad CD2 is manufactured in the same process using the same material as other structures of the display device DD, an additional process and cost may not be incurred. However, exemplary embodiments of the inventive concepts are not limited thereto, and various materials adoptable by a person skilled in the art may be included.

The first sub-blocking pad CDS1-1 may have substantially the same height as the data pad part DL-P, and the second sub-blocking pad CDS2-1 may have substantially the same height as the auxiliary electrode SPD. In this way, the second blocking pad CD2 is provided with two layers, and thus other wiring parts having the height equal to or lower than the height of the second blocking pad CD2 may be effectively protected from laser light generated in the laser patterning process.

In the above, the display device DD is exemplarily described as a liquid crystal display device, but hereinafter, descriptions will be provided when the display device DD is an organic light emitting display device as an example. However, exemplary embodiments of the inventive concepts are not limited to the organic light emitting display device, and, for example, the display device may be a micro light emitting display device including a micro LED.

Figure 12:
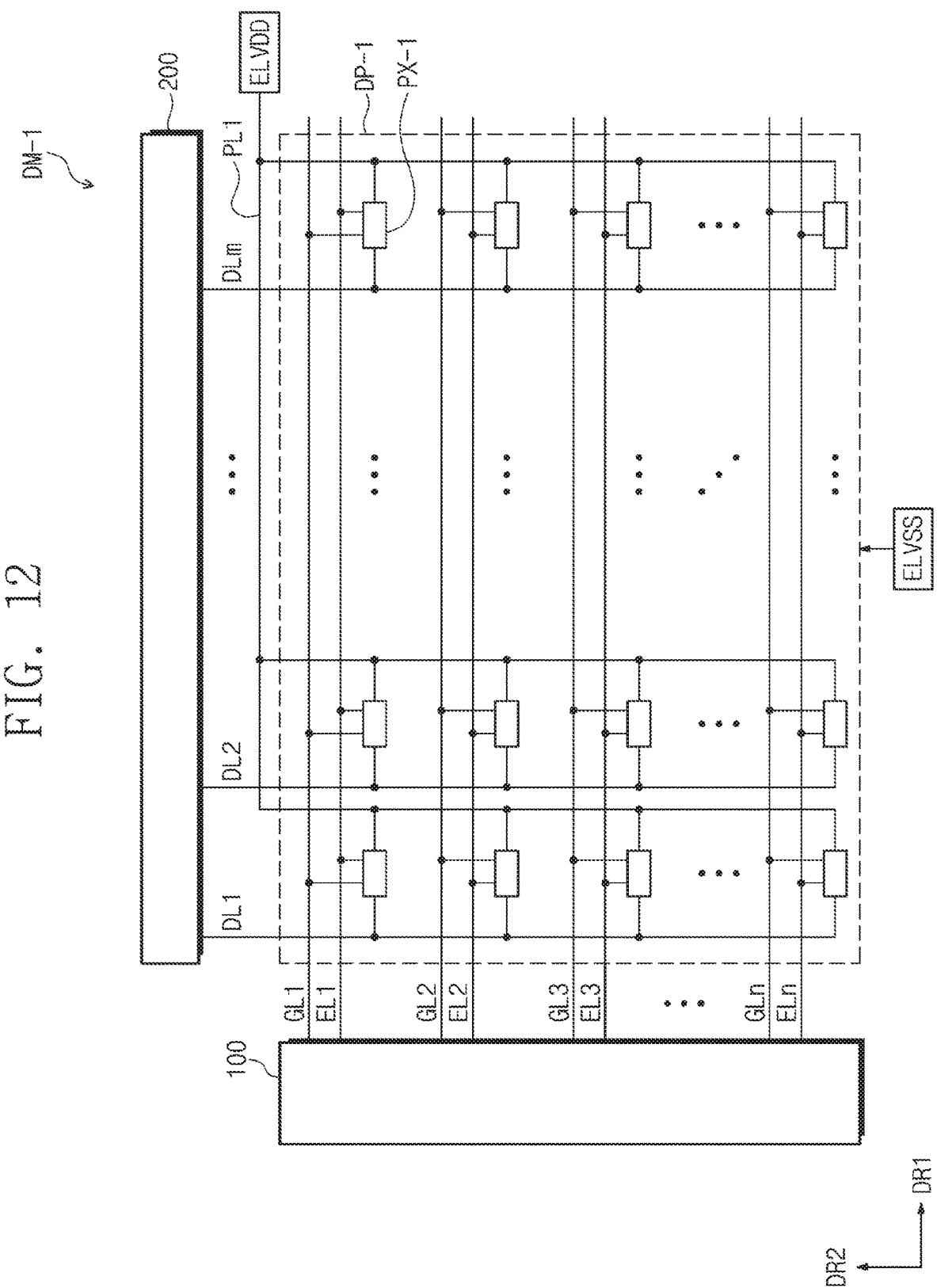
FIG. 12 is a block diagram of an organic light emitting display module according to an exemplary embodiment of the inventive concepts.
Figure 13:
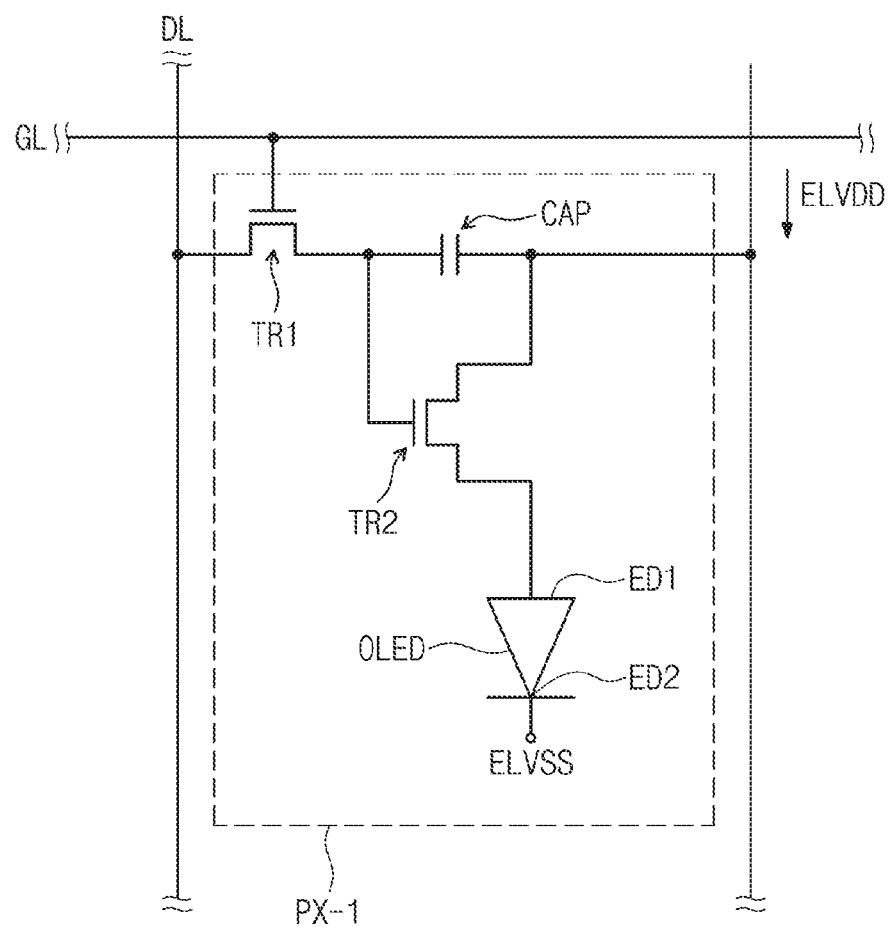
FIG. 13 is an equivalent circuit diagram of a pixel of an organic light emitting display panel according to an exemplary embodiment of the inventive concepts.

FIG. 12 is a block diagram of a display module DM-1 according to an exemplary embodiment of the inventive concepts. FIG. 13 is an equivalent circuit diagram of a pixel PX-1 of an organic light emitting display panel DP-1 according to an exemplary embodiment of the inventive concepts.

FIG. 12 illustrates that a plurality of gate signals and a plurality of emission control signals are output from one scan driving part 100, but exemplary embodiments of the inventive concepts are not limited thereto. In an exemplary embodiment of the inventive concepts, a plurality of scan driving parts divide and output the plurality of gate signals, and divide and output the plurality of emission control signals. In addition, in an exemplary embodiment of the inventive concepts, a driving circuit configured to generate and output the plurality of gate signals may be separated from a driving circuit configured to generate and output the plurality of emission control signals.

A data driving part 200 receives a data control signal (not shown) and image data (not shown) from a timing control part. The data driving part 200 converts the image data to data signals, and outputs the data signals to a plurality of data lines DL1 to DLm insulated from and configured to intersect with the gate lines GL1 to GLn. The data signals have analog voltages corresponding to grayscale values of image data.

The organic light emitting display module DM-1 includes the plurality of gate lines GL1 to GLn, a plurality of emission lines EL1 to ELn, the plurality of data lines $DL_1$ to DLm, and the plurality of pixels PX-1. The plurality of gate lines GL1 to GLn are extended in a first direction DR1 and arrayed in a second direction DR2 which is orthogonal to the first direction. Each of the emission lines EL1 to ELn may be arranged in parallel to a corresponding gate line from among the plurality of gate lines GL1 to GLn. The plurality of data lines DL1 to DLm and the plurality of gate lines GL1 to GLn are insulated from and intersect with each other.

Each of the plurality of pixels PX-1 is connected to a corresponding gate line among the plurality of gate lines GL1 to GLn, a corresponding emission line among the plurality of emission lines EL1 to ELn, and corresponding data lines among the plurality of data lines DL1 to DLm.

FIG. 13 is an equivalent circuit diagram of one of the plurality of pixels PX-1 of the organic light emitting display panel DP-1 according to an exemplary embodiment of the inventive concepts. As illustrated in FIG. 13, each of the pixels PX-1 includes an organic light emitting element OLED and a circuit part configured to control the organic light emitting element OLED. The circuit part includes a first transistor TR1, a second transistor TR2 and a capacitor CAP. On the other hand, the equivalent circuit diagram is not limited to the shown in FIG. 13, but may be modified and practiced in a variety of other embodiments.

The first transistor TR1 includes a control electrode connected to a gate line GL, an input electrode connected to a data line DL, and an output electrode. The first transistor TR1 outputs a data signal to be applied to the data line DL in response to a gate signal applied to the gate line GL.

The capacitor CAP includes an electrode connected to the first transistor TR1 and an electrode configured to receive a first power supply voltage ELVDD. The capacitor CAP charges a voltage corresponding to the data signal received from the first transistor TR1.

The second transistor TR2 includes a control electrode connected to the output electrode of the first transistor TR1 and the electrode of the capacitor CAP, an input electrode configured to receive the first power supply voltage ELVDD, and an output electrode. The output electrode of the second transistor TR2 is connected to the organic light emitting element OLED. The second transistor TR2 controls a driving current flowing through the organic light emitting element OLED in correspondence to a voltage stored in the capacitor CAP.

The organic light emitting element OLED includes a first electrode ED1 (or an anode) connected to the second transistor TR2 and configured to receive the first power supply voltage ELVDD, and a second electrode ED2 (or a cathode) configured to receive a second power supply voltage ELVSS. In addition, the organic light emitting element OLED includes an emission layer (not shown) disposed between the first electrode ED1 and the second electrode ED2. The organic light emitting element OLED emits light during a turn-on period of the second transistor TR2.

The first blocking pad CD1 and the second blocking pad CD2 of the embodiment described in relation to FIGS. 8 to 11B may be substantially and identically applied to the organic light emitting display panel DP according to an exemplary embodiment of the inventive concepts.

According to an exemplary embodiment of the inventive concepts, as the blocking pads are disposed between the signal lines, damage to the display panel, which may occur in a laser patterning process for providing the connection electrode, may be prevented or reduced.

According to an exemplary embodiment of the inventive concepts, damage to the display panel may be prevented or reduced in a manufacturing process, and thus durability of the display device is improved under the environment of high temperature and high humidity.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device comprising:
   a first base substrate comprising an upper surface, a lower surface, and a plurality of side surfaces connecting the upper surface and the lower surface, and the upper surface comprising a first part and a second part configured to surround the first part;
   a second base substrate configured to face the first base substrate;
   a liquid crystal layer disposed between the first base substrate and the second base substrate, and configured to overlap the first part and not to overlap the second part;
   a first connection electrode disposed on a first side surface among the plurality of side surfaces;
   a second connection electrode disposed on the first side surface and separated from the first connection electrode;
   a first signal transfer part disposed on the upper surface, extended in a first direction, and configured to contact the first connection electrode and receive an electrical signal;
   a second signal transfer part disposed on the upper surface, extended in the first direction, and configured to contact the second connection electrode and receive an electrical signal; and
   a first blocking pad configured to overlap the second part of the upper surface, disposed between the first signal transfer part and the second signal transfer part, and separated from the first signal transfer part and the second signal transfer part.

2. The display device of claim 1, wherein the first blocking pad is insulated from the first signal transfer part and the second signal transfer part.

3. The display device of claim 2, wherein the first blocking pad is extended in a second direction which intersects with the first direction.

4. The display device of claim 3, wherein the first signal transfer part comprises:
   a first pad part configured to contact the first connection electrode; and
   a first line part extended from the first pad part and having a smaller width than the first pad part, and
   the second signal transfer part comprises:
   a second pad part configured to contact the second connection electrode; and
   a second line part extended from the second pad part and having a smaller width than the second pad part.

5. The display device of claim 4, wherein the first blocking pad is disposed between the first line part and the second line part.

6. The display device of claim 5, further comprising:
   a transistor comprising a control electrode, an input electrode, and an output electrode, and disposed on the first part of the upper surface.

7. The display device of claim 6, wherein at least a part of the first blocking pad is disposed on a same layer as at least one of the control electrode, the input electrode, and the output electrode.

8. The display device of claim 6, wherein the first blocking pad comprises:
   a first sub-blocking pad provided in a same process as the control electrode; and
   a second sub-blocking pad provided in a same process as the input electrode and the output electrode.

9. The display device of claim 6, further comprising:
   a gate driving circuit and a data driving circuit,
   wherein any one of the gate driving circuit and the data driving circuit is electrically connected to the first connection electrode and the second connection electrode.

10. The display device of claim 9, further comprising:
    a third connection electrode disposed on a second side surface among the plurality of side surfaces of the first base substrate;
    a fourth connection electrode disposed on the second side surface and separated from the third connection electrode;
    a third signal transfer part disposed on the upper surface, extended in the second direction, and configured to contact the third connection electrode to receive an electrical signal;
    a fourth signal transfer part disposed on the upper surface, extended in the second direction, and configured to contact the fourth connection electrode to receive an electrical signal; and
    a second blocking pad configured to overlap the second part of the upper surface, disposed between the third signal transfer part and the fourth signal transfer part, and separated from the third signal transfer part and the fourth signal transfer part.

11. The display device of claim 10, wherein the other one of the gate driving circuit and the data driving circuit is electrically connected to the third connection electrode and the fourth connection electrode.

12. The display device of claim 10, wherein the second blocking pad is insulated from the third signal transfer part and the fourth signal transfer part.

13. The display device of claim 10, wherein the second blocking pad is extended in the first direction.

14. A display device comprising:
    a base member comprising a center area and an edge area configured to surround the center area;
    a plurality of transistors, each of which comprises a control electrode, an input electrode, and an output electrode, and is disposed on the center area;
    a plurality of pad parts disposed on the edge area;
    a plurality of signal lines electrically and respectively connected to the plurality of pad parts, and electrically and respectively connected to the plurality of transistors; and
    a blocking pad disposed on the edge area and between two adjacent signal lines among the plurality of signal lines,
    wherein at least a part of the blocking pad is disposed on a same layer as at least any one of the control electrode, the input electrode, and the output electrode.

15. The display device of claim 14, further comprising:
    a plurality of light emitting elements disposed on the base member, configured to overlap the center area, and electrically connected to the plurality of transistors.

16. The display device of claim 15, further comprising:
a plurality of connection electrodes disposed on one side surface of the base member and configured to respectively contact the plurality of pad parts.

17. The display device of claim 14, wherein the blocking pad comprises:
a first sub-blocking pad comprising a same material as the control electrode; and
a second sub-blocking pad comprising a same material as at least any one of the input electrode or the output electrode, and configured to overlap the first sub-blocking pad.

18. The display device of claim 14, wherein each of the plurality of signal lines is extended in a first direction,
the blocking pad is extended in a second direction which intersects with the first direction, and
the blocking pad is insulated from the plurality of signal lines.

19. The display device of claim 14, wherein
a width of each of the plurality of signal lines is smaller than that of each of the plurality of pad parts, and
at least a part of the blocking pad overlaps at least any one of the plurality of pad parts in a first direction.

20. The display device of claim 19, comprising a plurality of blocking pads,
wherein each of the plurality of blocking pads is disposed between the plurality of signal lines.

\* \* \* \* \*